United States Patent
Wu

(10) Patent No.: US 11,006,519 B2
(45) Date of Patent: May 11, 2021

(54) FLEXIBLE CIRCUIT BOARD AND DISPLAY PANEL

(71) Applicant: Wuhan China Star Optoelectronics Semiconductor Display Technology Co., Ltd., Wuhan (CN)

(72) Inventor: Jiashu Wu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 11 days.

(21) Appl. No.: 16/630,488

(22) PCT Filed: Aug. 1, 2018

(86) PCT No.: PCT/CN2018/098083
§ 371 (c)(1),
(2) Date: Jan. 13, 2020

(87) PCT Pub. No.: WO2019/218491
PCT Pub. Date: Nov. 21, 2019

(65) Prior Publication Data
US 2020/0163207 A1 May 21, 2020

(30) Foreign Application Priority Data
May 15, 2018 (CN) .......................... 201810462330.0

(51) Int. Cl.
*H05K 1/02* (2006.01)
*H05K 1/03* (2006.01)
*H05K 1/18* (2006.01)

(52) U.S. Cl.
CPC ......... *H05K 1/0281* (2013.01); *H05K 1/0306* (2013.01); *H05K 1/0393* (2013.01); *H05K 1/189* (2013.01); *H05K 2201/0145* (2013.01); *H05K 2201/10128* (2013.01)

(58) Field of Classification Search
CPC .. H05K 1/0281; H05K 1/0306; H05K 1/0393; H05K 1/189; H05K 2201/0145; H05K 2201/10128
USPC ........................................................ 361/749
See application file for complete search history.

(56) References Cited

U.S. PATENT DOCUMENTS

| 2006/0215377 A1 | 9/2006 | Nomura et al. |
| 2018/0206330 A1 | 7/2018 | Cao et al. |
| 2019/0159335 A1 | 5/2019 | Wu |

FOREIGN PATENT DOCUMENTS

| CN | 105960157 | 9/2016 |
| CN | 107743340 | 2/2018 |

*Primary Examiner* — Tremesha S Willis

(57) ABSTRACT

A flexible circuit board and a display panel are provided. The flexible circuit board includes a base body and a protective layer disposed on the base body. The protective layer includes a glue layer, a first cover layer, a patterned function layer, and a second cover layer sequentially stacked on the base body. The patterned function layer includes a frame and a plurality of bendable components disposed in the frame. The bendable components are arranged in the frame at intervals, and an arrangement direction of the bendable components is consistent with a bent direction of the flexible circuit board.

20 Claims, 1 Drawing Sheet

FLEXIBLE CIRCUIT BOARD AND DISPLAY PANEL

RELATED APPLICATIONS

This application is a National Phase of PCT Patent Application No. PCT/CN2018/098083 having International filing date of Aug. 1, 2018, which claims the benefit of priority of Chinese Patent Application No. 201810462330.0 filed on May 15, 2018. The contents of the above applications are all incorporated by reference as if fully set forth herein in their entirety.

FIELD AND BACKGROUND OF THE INVENTION

The present disclosure relates to the field of display technologies, and more particularly to a flexible circuit board and a display panel.

Nowadays, in a flexible active matrix organic light emitting diode (AMOLED) display panel design, a flexible circuit board is bonded to a display panel and the flexible circuit board is bent in order to achieve a narrow frame, thereby reducing a length of a non-display area of the display panel and achieving a high screen ratio. However, micro cracks, circuit breaking, or circuit peeling easily occurs after the flexible circuit board is bent, resulting in a poor display of the flexible AMOLED display panel.

In existing technologies, a photosensitive glue or a TUFFY glue is coated on a bonding area and a bent area of the flexible circuit board to prevent defects of the flexible circuit board after the flexible circuit board is bent. However, a large-area coating uniformity of the flexible circuit board is not easy to control, a coating thickness of the flexible circuit board is limited, thickness of the flexible circuit board is too thick to be easily bent, and strength of a glue is limited.

SUMMARY OF THE INVENTION

An object of the present disclosure is to provide a flexible circuit board and a display panel to make the flexible circuit board easier to bend, avoid a circuit damage, increase a strength of the flexible circuit board, and effectively protect the flexible circuit board.

To achieve the above object, an embodiment of the present disclosure provides a flexible circuit board. The flexible circuit board includes a base body and a protective layer disposed on the base body. The protective layer includes a glue layer, a first cover layer, a patterned function layer, and a second cover layer sequentially stacked on the base body. The patterned function layer includes a frame and a plurality of bendable components disposed in the frame. The bendable components are arranged in the frame at intervals, and an arrangement direction of the bendable components is consistent with a bent direction of the flexible circuit board. A material of the frame and a material of the bendable components are a flexible inorganic fiber material or a thin metal. A material of the first cover layer and a material of the second cover layer are polyimide or polyethylene terephthalate.

In an embodiment of the present disclosure, the flexible inorganic fiber material includes glass fiber, ceramic fiber, or carbon fiber.

In an embodiment of the present disclosure, the base body includes a bent area, and the protective layer is disposed on the bent area.

In an embodiment of the present disclosure, the base body further includes a bonding area configured to bond a panel, an area of the protective layer is greater than an area of the bent area, and the protective layer extends from the bent area to the bonding area.

In an embodiment of the present disclosure, a side of the protective layer in contact with the bonding area includes an adhesive material, such that the flexible circuit board is bonded to the panel via the adhesive material.

In an embodiment of the present disclosure, a projection of the patterned function layer on the first cover layer is within the first cover layer.

In an embodiment of the present disclosure, a projection of the first cover layer on the base body coincides with a projection of the second cover layer on the base body.

An embodiment of the present disclosure further provides a flexible circuit board. The flexible circuit board includes a base body and a protective layer disposed on the base body. The protective layer includes a glue layer, a first cover layer, a patterned function layer, and a second cover layer sequentially stacked on the base body. The patterned function layer includes a frame and a plurality of bendable components disposed in the frame. The bendable components are arranged in the frame at intervals, and an arrangement direction of the bendable components is consistent with a bent direction of the flexible circuit board.

In an embodiment of the present disclosure, a material of the frame and a material of the bendable components are a flexible inorganic fiber material or a thin metal.

In an embodiment of the present disclosure, the flexible inorganic fiber material includes glass fiber, ceramic fiber, or carbon fiber.

In an embodiment of the present disclosure, the base body includes a bent area, and the protective layer is disposed on the bent area.

In an embodiment of the present disclosure, the base body further includes a bonding area configured to bond a panel, an area of the protective layer is greater than an area of the bent area, and the protective layer extends from the bent area to the bonding area.

In an embodiment of the present disclosure, a side of the protective layer in contact with the bonding area includes an adhesive material, such that the flexible circuit board is bonded to the panel via the adhesive material.

In an embodiment of the present disclosure, a material of the first cover layer and a material of the second cover layer are polyimide or polyethylene terephthalate.

In an embodiment of the present disclosure, a projection of the patterned function layer on the first cover layer is within the first cover layer.

In an embodiment of the present disclosure, a projection of the first cover layer on the base body coincides with a projection of the second cover layer on the base body.

An embodiment of the present disclosure further provides a display panel including a flexible circuit board. The flexible circuit board includes a base body and a protective layer disposed on the base body. The protective layer includes a glue layer, a first cover layer, a patterned function layer, and a second cover layer sequentially stacked on the base body. The patterned function layer includes a frame and a plurality of bendable components disposed in the frame. The bendable components are arranged in the frame at intervals, and an arrangement direction of the bendable components is consistent with a bent direction of the flexible circuit board.

In an embodiment of the present disclosure, a material of the frame and a material of the bendable components are a flexible inorganic fiber material or a thin metal.

In an embodiment of the present disclosure, the flexible inorganic fiber material includes glass fiber, ceramic fiber, or carbon fiber.

In an embodiment of the present disclosure, the base body includes a bent area, and the protective layer is disposed on the bent area.

The embodiment of the present disclosure provides the flexible circuit board and the display panel. The glue layer, the first cover layer, the patterned function layer, and the second cover layer are disposed on the base body of the flexible circuit board. The patterned function layer includes the frame and the bendable components disposed in the frame. The bendable components are arranged in the frame at the intervals, and the arrangement direction of the bendable components is consistent with the bent direction of the flexible circuit board, such that when the flexible circuit board is bent, the bendable components arranged at the intervals play a role of facilitating bending of the flexible circuit board. In addition, the frame plays a role in fixing, protecting, and strengthening the flexible circuit board, avoiding a circuit damage, increasing a strength of the flexible circuit board, effectively protecting the flexible circuit board, and improving a performance of the display panel.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DESCRIPTION OF SPECIFIC EMBODIMENTS OF THE INVENTION

Figure 1:
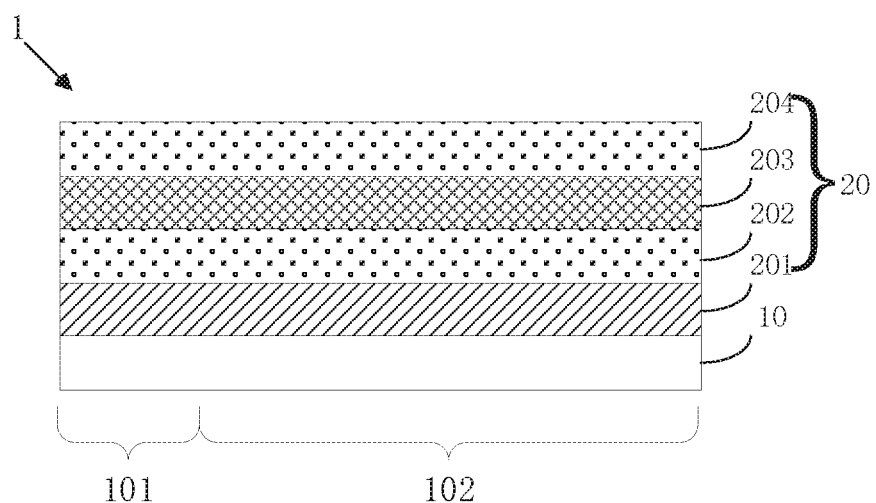
FIG. 1 is a schematic structural diagram of a flexible circuit board according to an embodiment of the present disclosure.

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary and are intended to illustrate and interpret the present disclosure, which shall not be construed as causing limitations to the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interreaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

Figure 2:
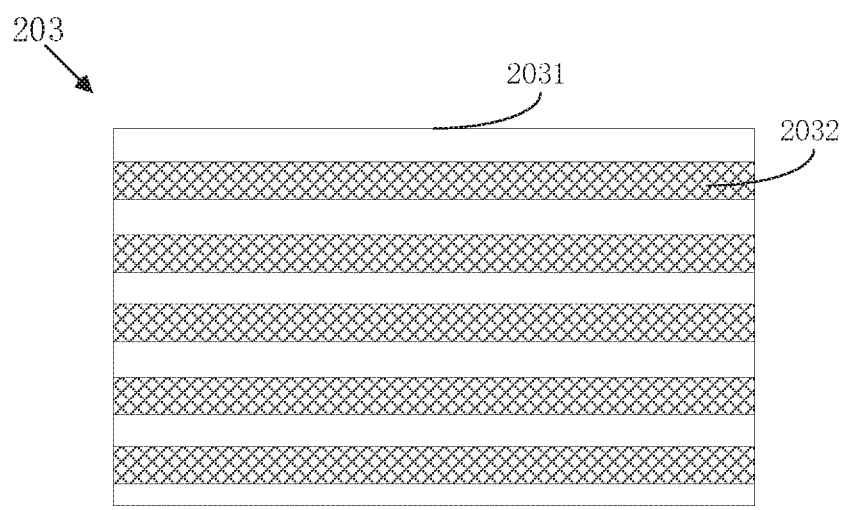
FIG. 2 is a schematic plan view of a patterned function layer in a flexible circuit board according to an embodiment of the present disclosure.

FIG. 1 is a schematic structural diagram of a flexible circuit board according to an embodiment of the present disclosure. FIG. 2 is a schematic plan view of a patterned function layer in a flexible circuit board according to an embodiment of the present disclosure. Refer to FIG. 1 and FIG. 2, an embodiment of the present disclosure provides a flexible circuit board 1. The flexible circuit board 1 includes a base body 10 and a protective layer 20 disposed on the base body 10. The protective layer 20 includes a glue layer 201, a first cover layer 202, a patterned function layer 203, and a second cover layer 204 sequentially stacked on the base body 10.

The glue layer 201, the first cover layer 202, the patterned function layer 203, and the second cover layer 204 are disposed on the base body 10 of the flexible circuit board 1, such that the first cover layer 202, the patterned function layer 203, and the second cover layer 204 replace part of a glue layer in existing technologies, thickness and a number of the glue layer are reduced to prevent glue overflow, the flexible circuit board 1 is more easily bent after the thickness of the glue layer is reduced, and micro cracking, circuit breakage, or circuit peeling of the flexible circuit board 1 can be prevented.

Further, the patterned function layer 203 includes a frame 2031 and a plurality of bendable components 2032 disposed in the frame 2031. The bendable components 2032 are arranged in the frame 2031 at intervals, and an arrangement direction of the bendable components 2032 is consistent with a bent direction of the flexible circuit board 1, such that the bendable components 2032 arranged at the intervals play a role of facilitating bending of the flexible circuit board 1. In addition, the frame 2031 plays a role in fixing, protecting, and strengthening the flexible circuit board 1, avoiding circuit damage, increasing strength of the flexible circuit board 1, effectively protecting the flexible circuit board 1, and improving performance of the display panel.

In an embodiment of the present disclosure, a material of the frame 2031 of the patterned function layer 203 and a material of the bendable components 2032 of the patterned function layer 203 are a flexible inorganic fiber material or a thin metal. The patterned function layer 203 makes the flexible circuit board 1 have characteristics of a certain strength and easy bending. The flexible inorganic fiber material may include glass fiber, ceramic fiber, or carbon fiber. It is understood that, when the patterned function layer 203 is formed, the frame 2031 and the bendable components 2032 may be formed by different processes, such that the frame 2031 has characteristics of high strength and easy bending, and the bendable components 2032 have characteristics of high strength, easy molding, and easy processing.

Further, a projection of the patterned function layer 203 on the first cover layer 202 is within the first cover layer 202. In addition, a projection of the first cover layer 202 on the base body 10 coincides with a projection of the second cover layer 204 on the base body 10.

In the flexible circuit board 1 of an embodiment, a material of the first cover layer 202 and a material of the second cover layer 204 are polyimide or polyethylene terephthalate. That is, both the first cover layer 202 and the second cover layer 204 have characteristics of easy molding and easy bending.

In an embodiment of the present disclosure, the base body 10 includes a bent area 101, and the protective layer 20 is disposed on the bent area 101. When the protective layer 20 is bent at the bent area 101, the bent area 101 can be bent more easily than the prior art, and a strength of the bent area 101 can also be increased, such that the bent area 101 can be effectively protected.

In an embodiment of the present disclosure, the base body 10 further includes a bonding area 102 configured to bond a panel and connect the flexible circuit board 1 to the panel. An area of the protective layer 20 is greater than an area of the bent area 101, and the protective layer 20 extends from the bent area 101 to the bonding area 102. The protective layer 20 is disposed on the bent area 101 and the bonding area 102. A side of the protective layer 20 in contact with the bonding area 102 includes an adhesive material, such that the flexible circuit board 1 is bonded to the panel via the adhesive material.

An embodiment of the present disclosure further provides a display panel including the above-mentioned flexible circuit board. For details, reference may be made to the above description, and no further description is provided herein.

The embodiment of the present disclosure provides the flexible circuit board and the display panel. The glue layer, the first cover layer, the patterned function layer, and the second cover layer are disposed on the base body of the flexible circuit board. The patterned function layer includes the frame and the bendable components disposed in the frame. The bendable components are arranged in the frame at the intervals, and the arrangement direction of the bendable components is consistent with the bent direction of the flexible circuit board, such that when the flexible circuit board is bent, the bendable components arranged at the intervals play a role of facilitating bending of the flexible circuit board. In addition, the frame plays a role in fixing, protecting, and strengthening the flexible circuit board, avoiding circuit damage, increasing strength of the flexible circuit board, effectively protecting the flexible circuit board, and improving performance of the display panel.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

The invention claimed is:

1. A flexible circuit board, comprising:
a base body; and
a protective layer disposed on the base body;
wherein the protective layer comprises a glue layer, a first cover layer, a patterned function layer, and a second cover layer sequentially stacked on the base body, the patterned function layer comprises a frame and a plurality of bendable components disposed in the frame, the bendable components are arranged in the frame at intervals, and an arrangement direction of the bendable components is consistent with a bent direction of the flexible circuit board;
wherein a material of the frame and a material of the bendable components are a flexible inorganic fiber material or a thin metal, a material of the first cover layer and a material of the second cover layer are polyimide or polyethylene terephthalate.

2. The flexible circuit board according to claim 1, wherein the flexible inorganic fiber material comprises glass fiber, ceramic fiber, or carbon fiber.

3. The flexible circuit board according to claim 1, wherein the base body comprises a bent area, and the protective layer is disposed on the bent area.

4. The flexible circuit board according to claim 3, wherein the base body further comprises a bonding area configured to bond a panel, an area of the protective layer is greater than an area of the bent area, and the protective layer extends from the bent area to the bonding area.

5. The flexible circuit board according to claim 4, wherein a side of the protective layer in contact with the bonding area comprises an adhesive material, such that the flexible circuit board is bonded to the panel via the adhesive material.

6. The flexible circuit board according to claim 1, wherein a projection of the patterned function layer on the first cover layer is within the first cover layer.

7. The flexible circuit board according to claim 1, wherein a projection of the first cover layer on the base body coincides with a projection of the second cover layer on the base body.

8. A flexible circuit board, comprising:
a base body; and
a protective layer disposed on the base body;
wherein the protective layer comprises a glue layer, a first cover layer, a patterned function layer, and a second cover layer sequentially stacked on the base body, the patterned function layer comprises a frame and a plurality of bendable components disposed in the frame, the bendable components are arranged in the frame at intervals, and an arrangement direction of the bendable components is consistent with a bent direction of the flexible circuit board.

9. The flexible circuit board according to claim 8, wherein a material of the frame and a material of the bendable components are a flexible inorganic fiber material or a thin metal.

10. The flexible circuit board according to claim 9, wherein the flexible inorganic fiber material comprises glass fiber, ceramic fiber, or carbon fiber.

11. The flexible circuit board according to claim 8, wherein the base body comprises a bent area, and the protective layer is disposed on the bent area.

12. The flexible circuit board according to claim 11, wherein the base body further comprises a bonding area configured to bond a panel, an area of the protective layer is greater than an area of the bent area, and the protective layer extends from the bent area to the bonding area.

13. The flexible circuit board according to claim 12, wherein a side of the protective layer in contact with the bonding area comprises an adhesive material, such that the flexible circuit board is bonded to the panel via the adhesive material.

14. The flexible circuit board according to claim 8, wherein a material of the first cover layer and a material of the second cover layer are polyimide or polyethylene terephthalate.

15. The flexible circuit board according to claim 8, wherein a projection of the patterned function layer on the first cover layer is within the first cover layer.

16. The flexible circuit board according to claim 8, wherein a projection of the first cover layer on the base body coincides with a projection of the second cover layer on the base body.

17. A display panel, comprising a flexible circuit board, the flexible circuit board, comprising:
a base body; and
a protective layer disposed on the base body;
wherein the protective layer comprises a glue layer, a first cover layer, a patterned function layer, and a second cover layer sequentially stacked on the base body, the patterned function layer comprises a frame and a plurality of bendable components disposed in the frame, the bendable components are arranged in the frame at intervals, and an arrangement direction of the bendable components is consistent with a bent direction of the flexible circuit board.

18. The display panel according to claim 17, wherein a material of the frame and a material of the bendable components are a flexible inorganic fiber material or a thin metal.

19. The display panel according to claim 17, wherein the flexible inorganic fiber material comprises glass fiber, ceramic fiber, or carbon fiber.

20. The display panel according to claim 17, wherein the base body comprises a bent area, and the protective layer is disposed on the bent area.

* * * * *